(12) United States Patent
Lee et al.

(10) Patent No.: US 8,174,020 B2
(45) Date of Patent: May 8, 2012

(54) THIN FILM TRANSISTOR ARRAY PANEL AND METHOD FOR MANUFACTURING THE SAME

(75) Inventors: Young-Wook Lee, Suwon-si (KR); Hong-Suk Yoo, Anyang-si (KR); Jean-Ho Song, Seoul (KR); Jae-Hyoung Youn, Seoul (KR); Woo-Geun Lee, Yongin-si (KR); Ki-Won Kim, Suwon-si (KR); Jong-In Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 323 days.

(21) Appl. No.: 12/556,277

(22) Filed: Sep. 9, 2009

(65) Prior Publication Data
US 2010/0140610 A1   Jun. 10, 2010

(30) Foreign Application Priority Data

Dec. 10, 2008   (KR) .......................... 10-2008-0125449

(51) Int. Cl.
*H01L 27/14* (2006.01)
(52) U.S. Cl. ............................... 257/72; 257/43; 257/59
(58) Field of Classification Search ................... 257/43, 257/59, 72
See application file for complete search history.

*Primary Examiner* — Anthony Ho
(74) *Attorney, Agent, or Firm* — Innovation Counsel LLP

(57) ABSTRACT

A thin film transistor substrate according to an embodiment of the present invention includes: an insulation substrate; a gate line formed on the insulation substrate; a first interlayer insulating layer formed on the gate line; a data line and a gate electrode formed on the first interlayer insulating layer; a gate insulating layer formed on the data line and gate electrode; a semiconductor formed on the gate insulating layer and overlapping the gate electrode; a second interlayer insulating layer formed on the semiconductor; a first connection formed on the second interlayer insulating layer and electrically connecting the gate line and the gate electrode to each other; a drain electrode connected to the semiconductor; a pixel electrode connected to the drain electrode; and a second connection connecting the data line and the semiconductor to each other.

20 Claims, 13 Drawing Sheets

THIN FILM TRANSISTOR ARRAY PANEL AND METHOD FOR MANUFACTURING THE SAME

CROSS-REFERENCE TO RELATED APPLICATIONS

This application claims priority to and the benefit of Korean Patent Application No. 10-2008-0125449 filed in the Korean Intellectual Property Office on Dec. 10, 2008, the entire contents of which are incorporated herein by reference.

BACKGROUND

1. Technical Field

The present invention generally relates to thin film transistor arrays and, more particularly, to a thin film transistor substrate and a method for its manufacture.

2. Related Art

A thin film transistor (TFT) substrate is generally used as a circuit board for independently driving each pixel in a liquid crystal display (LCD) or an organic light emitting display (OLED) device. The thin film transistor substrate includes a scanning signal line (or a gate signal line) transmitting a scanning signal, an image signal line (or a data signal line) transmitting an image signal, and a thin film transistor connected to the gate signal line and the data signal line.

With an increase in size and resolution of the liquid crystal display, resistance of the metal wiring such as the gate signal line and the data signal line formed in the thin film transistor substrate is increased such that an RC (resistor-capacitor time constant) delay is generated. To reduce the resistance of the metal wiring, a method using copper as a metal having low resistance has been developed.

The copper wiring reacts with the organic layer, however, such that the organic material is adsorbed on the surface of the signal wiring. If this phenomenon is generated on the gate electrode when forming the gate wire made of the copper material, display deterioration may occur.

The above information disclosed in this Background section is only for enhancement of understanding of the background of the invention and therefore it may contain information that does not form the prior art that is already known in this country to a person of ordinary skill in the art.

SUMMARY

Embodiments of the present invention provide a thin film transistor substrate and a method of manufacturing the substrate including copper wiring that may not be influenced when used with an organic layer.

A thin film transistor substrate according to an embodiment of the present invention includes: an insulation substrate; a gate line formed on the insulation substrate; a first interlayer insulating layer formed on the gate line; a data line and a gate electrode formed on the first interlayer insulating layer; a gate insulating layer formed on the data line and gate electrode; a semiconductor formed on the gate insulating layer and overlapping the gate electrode; a second interlayer insulating layer formed on the semiconductor; a first connection formed on the second interlayer insulating layer and electrically connecting the gate line and the gate electrode to each other; a drain electrode connected to the semiconductor; a pixel electrode connected to the drain electrode; and a second connection connecting the data line and the semiconductor to each other.

The pixel electrode, the drain electrode, and the first and second connections may be formed of the same material. The pixel electrode and the drain electrode may be formed as one body. The first interlayer insulating layer may be made of an organic insulating material. The gate line may include a copper layer. The gate line may further include a seed layer formed under the copper layer. The seed layer may be made of Ti or Ni. The semiconductor may be made of an oxide semiconductor. The semiconductor may be made of an oxide semiconductor including at least one of Zn, Ga, Sn, Hf, and In. A storage electrode line formed on the first interlayer insulating layer and parallel to the data line may be further included. The storage electrode line may include a plurality of storage electrodes extending from the storage electrode line. A storage electrode line formed on the insulation substrate and parallel to the gate line may be further included. The storage electrode line formed on the insulation substrate and parallel to the gate line may include a plurality of protrusions extending from the storage electrode line. A capacitive conductor formed on the first interlayer insulating layer and connected to the storage electrode line formed on the insulation substrate and parallel to the gate line may be further included. A third connection formed on the second interlayer insulating layer and connecting the storage electrode line formed on the insulation substrate and parallel to the gate line and the capacitive conductor to each other may be further included. The third connection may be made of the same material as the pixel electrode. A storage electrode line formed on the insulation substrate and parallel to the gate line, a capacitive conductor formed on the first interlayer insulating layer and overlapping the pixel electrode, and a third connection formed on the second interlayer insulating layer and connecting the storage electrode line and the capacitive conductor to each other may be further included. The second interlayer insulating layer may be made of silicon oxide or silicon nitride.

A method of manufacturing a thin film transistor substrate according to an embodiment of the present invention includes: forming a gate line on an insulation substrate; forming a first interlayer insulating layer on the gate line; forming a data line and a gate electrode on the first interlayer insulating layer; forming a gate insulating layer on the data line and the gate electrode; forming a semiconductor overlapping the gate electrode on the gate insulating layer; forming a second interlayer insulating layer on the semiconductor; and forming a first connection electrically connecting the gate line and the gate electrode to each other on the second interlayer insulating layer, a pixel electrode connected to the semiconductor, and a second connection connecting the data line and the semiconductor to each other.

The gate line may be made of copper through a sputtering or plating method. The semiconductor may be formed of an oxide including at least one of Zn, Ga, Sn, Hf, and In. A storage electrode line parallel to the data line may be formed on the first interlayer insulating layer in the forming of the data line and the gate electrode on the first interlayer insulating layer. A storage electrode line parallel to the gate line may be formed on the insulation substrate in the forming of the gate line on the insulation substrate. A capacitive conductor overlapping the storage electrode line formed on the insulation substrate may be formed on the first interlayer insulating layer in the forming of the data line and the gate electrode on the first interlayer insulating layer, and a third connection connecting the storage electrode line formed on the insulation substrate and the capacitive conductor to each other may be formed on the second interlayer insulating layer in the forming of the first connection and the second connection.

As described above, in the thin film transistor substrate according to an embodiment of the present invention, the gate electrode is formed on the organic insulator such that deterioration of the display generation due to the adhesion of the organic material to the gate electrode may be prevented. Accordingly, a thin film transistor substrate of high quality may be provided.

DETAILED DESCRIPTION

Embodiments of the present invention will be described more fully hereinafter with reference to the accompanying drawings, in which embodiments of the invention are shown. As those skilled in the art would realize, the described embodiments may be modified in various different ways, all without departing from the spirit or scope of the present invention.

In the drawings, the thickness, for example, of layers, films, panels, and regions may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 1:
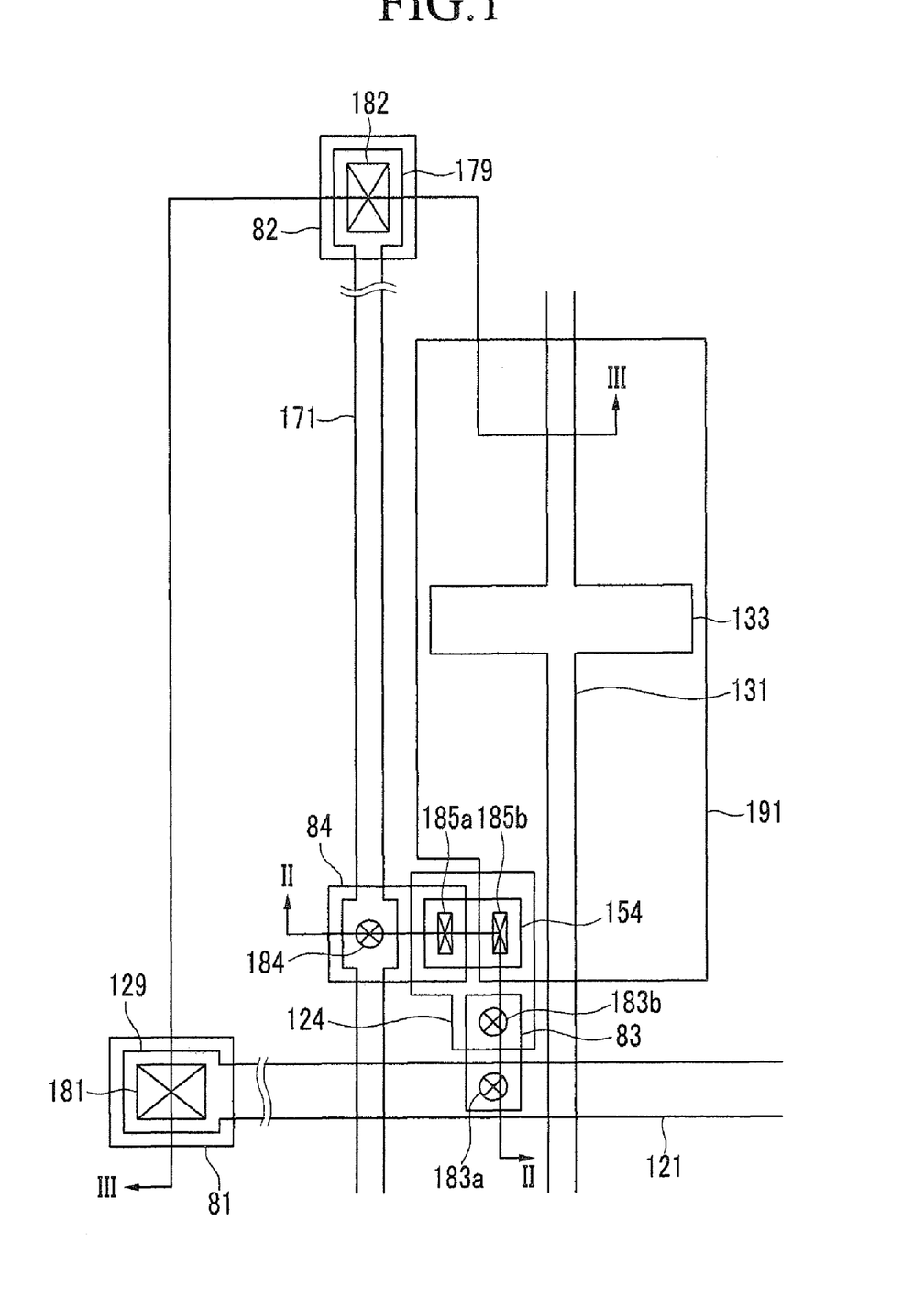
FIG. 1 is a layout view of a thin film transistor substrate according to an embodiment of the present invention.
Figure 2:
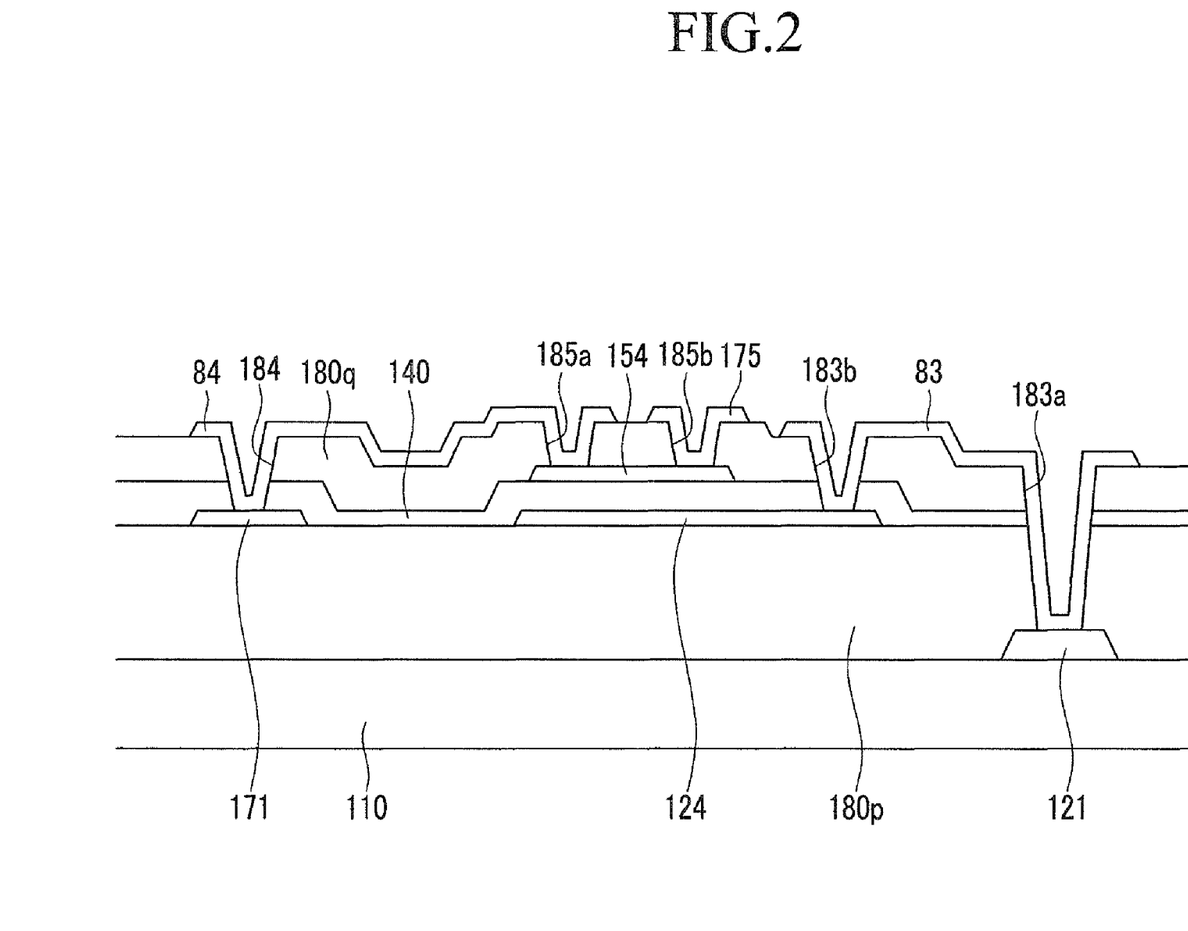
FIG. 2 is a cross-sectional view taken along the line II-II of FIG. 1 according to an embodiment of the present invention.
Figure 3:
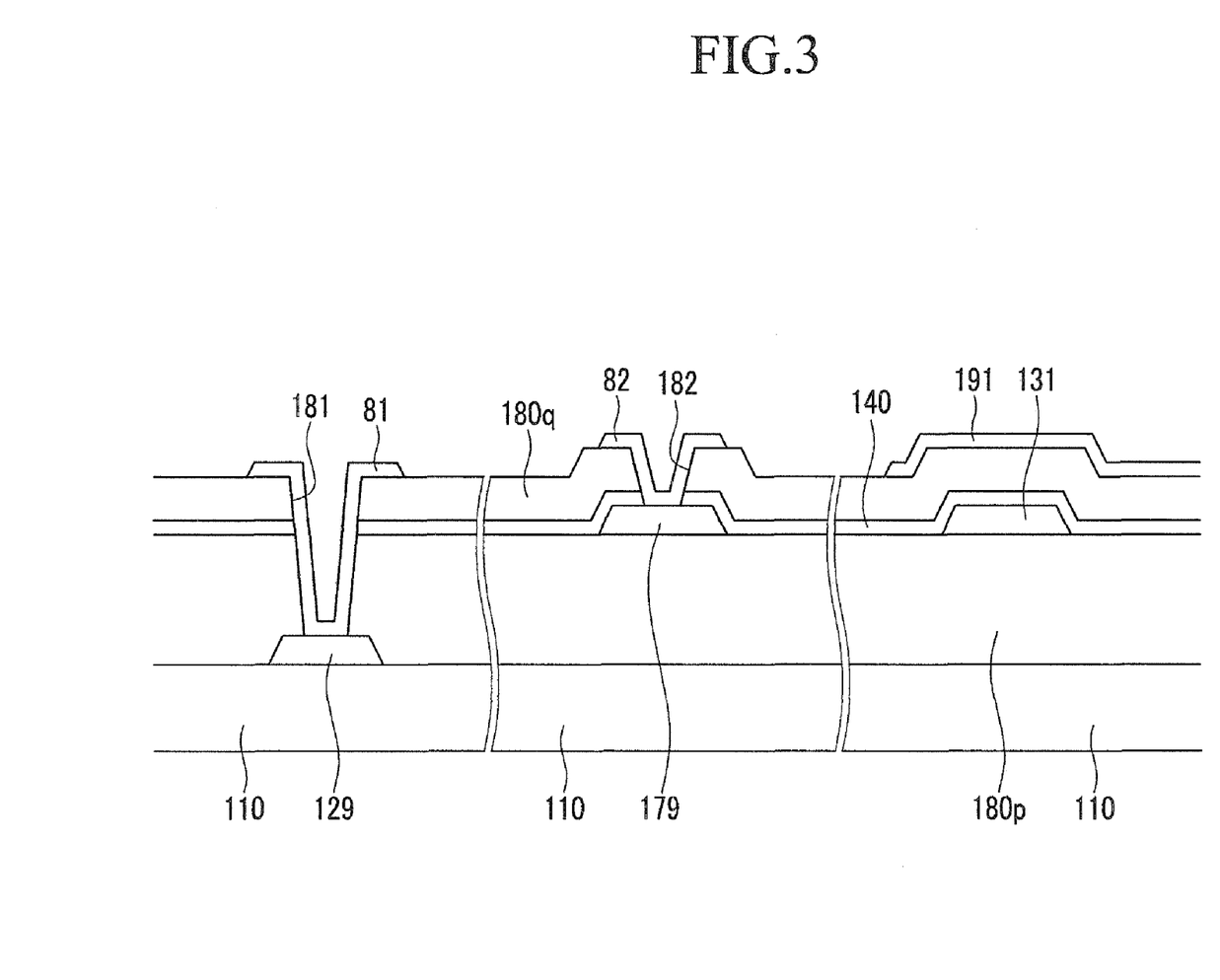
FIG. 3 is a cross-sectional view taken along the line III-II of FIG. 2 according to an embodiment of the present invention.

A thin film transistor substrate according to an embodiment of the present invention will now be described with reference to FIG. 1 through FIG. 3. FIG. 1 is a layout view of a thin film transistor substrate according to an embodiment of the present invention; FIG. 2 is a cross-sectional view taken along the line II-II of FIG. 1; and FIG. 3 is a cross-sectional view taken along the line III-III of FIG. 2, in accordance with one or more embodiments.

As shown in FIG. 1 and FIG. 2, a gate line 121 is formed on a transparent substrate 110. The gate line 121 for transmitting gate signals extends in a transverse direction, and includes an end portion 129 having a wide width for connection to another layer or an external driving circuit. The gate line 121 may be made of Cu, and may be formed through sputtering or plating. When it is formed through plating, a seed layer may be formed under the copper layer. The seed layer may be made of Ti or Ni.

A first interlayer insulating layer 180p is formed on the gate line 121. The first interlayer insulating layer 180p may be made of an organic insulator that planarizes the substrate, and the organic insulator may have photosensitivity and a dielectric constant of about 4.0 or less.

A gate electrode 124, a storage electrode line 131, and a data line 171 are formed on the first interlayer insulating layer 180p. The gate electrode 124, the storage electrode line 131, and the data line 171 may be formed of a refractory metal such as molybdenum, chromium, tantalum, titanium, or an alloy thereof, and may have a multi-film structure including a refractory metal film (not shown) and a low resistance conductive layer (not shown). Examples of the multilayer may be double layers including a chromium or molybdenum (alloy) lower layer and an aluminum (alloy) upper layer, and triple layers including a molybdenum (alloy) lower layer, an aluminum (alloy) middle layer, and a molybdenum (alloy) upper layer. However, the data line 171 and the gate electrode 124 may be made of various other metals or conductors.

The data line 171 for transmitting data voltages extends substantially in the longitudinal direction while intersecting the gate line 121, and includes an end portion 179 for connecting to other layers or an external driving circuit. The storage electrode line 131 applied with a predetermined voltage extends parallel to the data line 171, thereby intersecting the gate line 121. The storage electrode line 131 includes a storage electrode 133 protruding right and left from the storage electrode line 131.

A gate insulating layer 140 is formed on the gate electrode 124, the storage electrode line 131, and the data line 171. The gate insulating layer 140 may be made of silicon oxide (SiO2) or silicon nitride (SiNx).

A semiconductor 154 is formed on the gate insulating layer 140. The semiconductor 154 is made of an oxide semiconductor. The semiconductor 154 is made of an oxide basically including zinc (Zn), gallium (Ga), tin (Sn), or indium (In), or an oxide semiconductor of a composite oxide thereof such as zinc oxide (ZnO), indium-gallium-zinc oxide (InGaZnO4), indium-zinc oxide (Zn—In—O), or zinc-tin oxide (Zn—Sn—O). The oxide semiconductor has low photosensitivity such that an additional light blocking film for preventing light from being transmitted to the semiconductor may not be necessary.

A second interlayer insulating layer 180q is formed on the semiconductor 154. The second interlayer insulating layer 180q may be made of an inorganic material such as silicon nitride and silicon oxide. The second interlayer insulating layer 180q has first and second contact holes 185a and 185b exposing the semiconductor 154. The second interlayer insulating layer 180q and the gate insulating layer 140 have contact holes 184 and 183b respectively exposing the data line 171 and the gate electrode 124. The second interlayer insulating layer 180q, the gate insulating layer 140, and the first interlayer insulating layer 180p have a contact hole 183a exposing the gate line 121.

A pixel electrode 191 including a drain electrode 175, first and second connections 83 and 84, and contact assistants 81 and 82 are formed on the second interlayer insulating layer 180q. The drain electrode 175 is connected to the semiconductor 154 through the contact hole 185b, and the drain electrode 175 may be made of the same material as the pixel electrode 191 as one body. The first connection 83 connects the gate electrode 124 and the gate line 121 to each other through the contact holes 183a and 183b, and the second connection 84 connects the data line 171 and the semiconductor 154 to each other through the contact holes 184 and 185a.

The gate electrode 124, the second connection 84, and the drain electrode 175 form a thin film transistor (TFT) Q along with the semiconductor 154. The second connection 84 is used as a source electrode of the thin film transistor Q. The channel of the thin film transistor Q is formed in the semiconductor 154 between the second connection 84 and the drain electrode 175.

The signal of the gate line 121 is transmitted to the gate electrode 124 through the first connection 83, and the signal of the data line 171 is transmitted to the semiconductor 154 through the second connection 84. If the gate signal is transmitted (e.g., present), the data signal is transmitted to the pixel electrode 191 through the second connection 84.

The pixel electrode 191, the first and second connections 83 and 84, and the contact assistants 81 and 82 may be made of a transparent conductive oxide such as ITO (indium-tin-oxide) or IZO (indium-zinc-oxide). In an embodiment of the present invention, the semiconductor is made of the oxide semiconductor that can be an ohmic contact such that the oxide semiconductor 154 is contacted directly to the conductive oxide forming the pixel electrode 191. The pixel electrode 191 overlaps the storage electrode line 131 and the storage electrode 133, thereby forming a storage capacitor.

In an embodiment of the present invention, the first interlayer insulating layer 180p is made of the organic material to form (e.g., cover) the gate line 121 made of copper having low resistance and to smooth a step due to the thickness of the copper layer. Also, the first interlayer insulating layer 180p is made of the organic material such that parasitic capacitance due to the gate line 121 is eliminated, thereby reducing the signal delay of the gate line 121.

Also, in an embodiment of the present invention, the gate electrode 124 is formed on the first interlayer insulating layer 180p such that contamination of the gate electrode 124 by the organic material of the first interlayer insulating layer 180p may be prevented, thereby reducing the deterioration of the display quality.

Next, a method of manufacturing a thin film transistor substrate will be described with reference to FIG. 4 through FIG. 11 as well as FIG. 2 and FIG. 3. FIG. 4 to FIG. 11 are cross-sectional views showing intermediate steps in a method of manufacturing a thin film transistor substrate according to an embodiment of the present invention.

Figure 4:
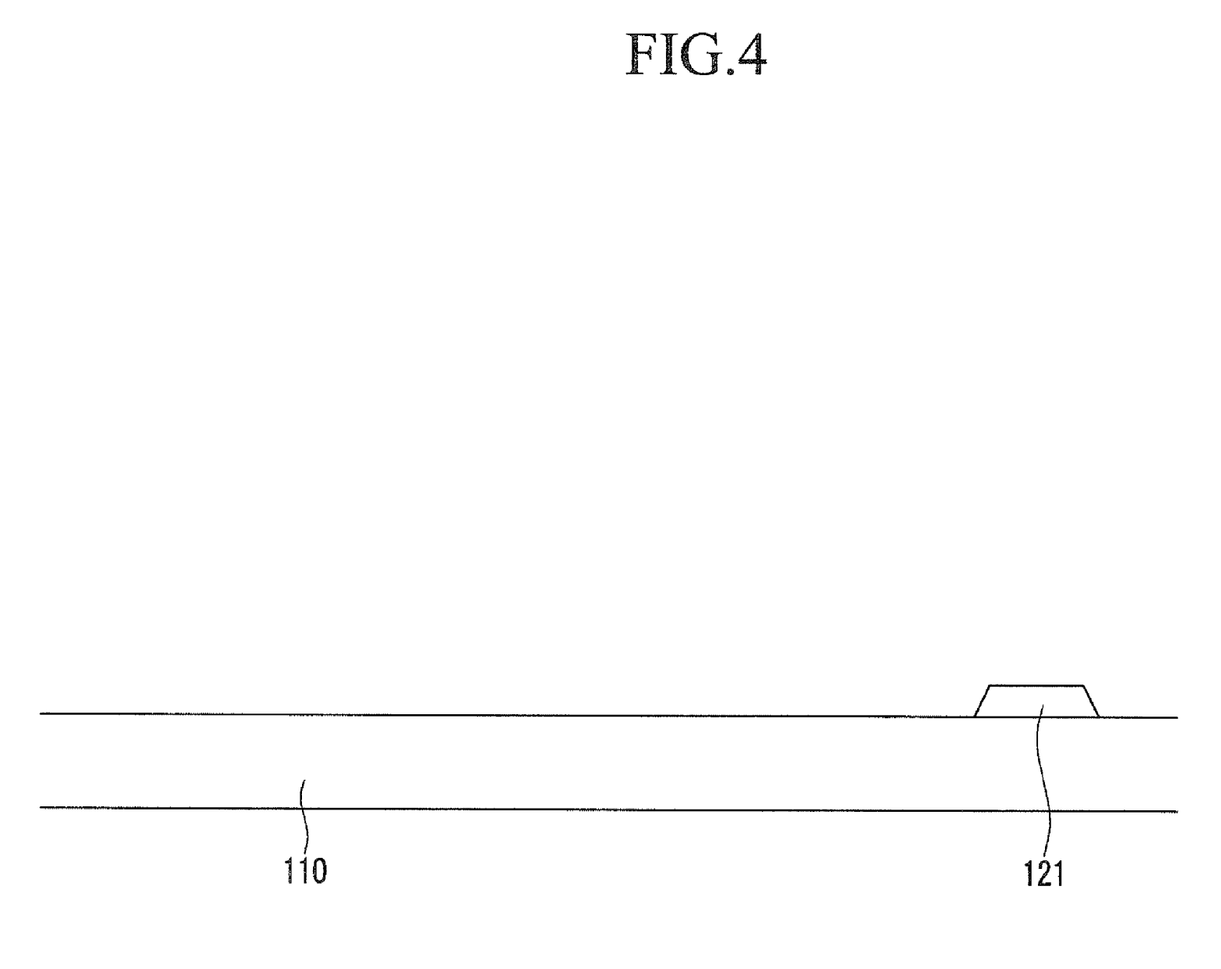
FIG. 4 to FIG. 11 are cross-sectional views showing intermediate steps in a manufacturing method of a thin film transistor substrate according to an embodiment of the present invention.
Figure 5:
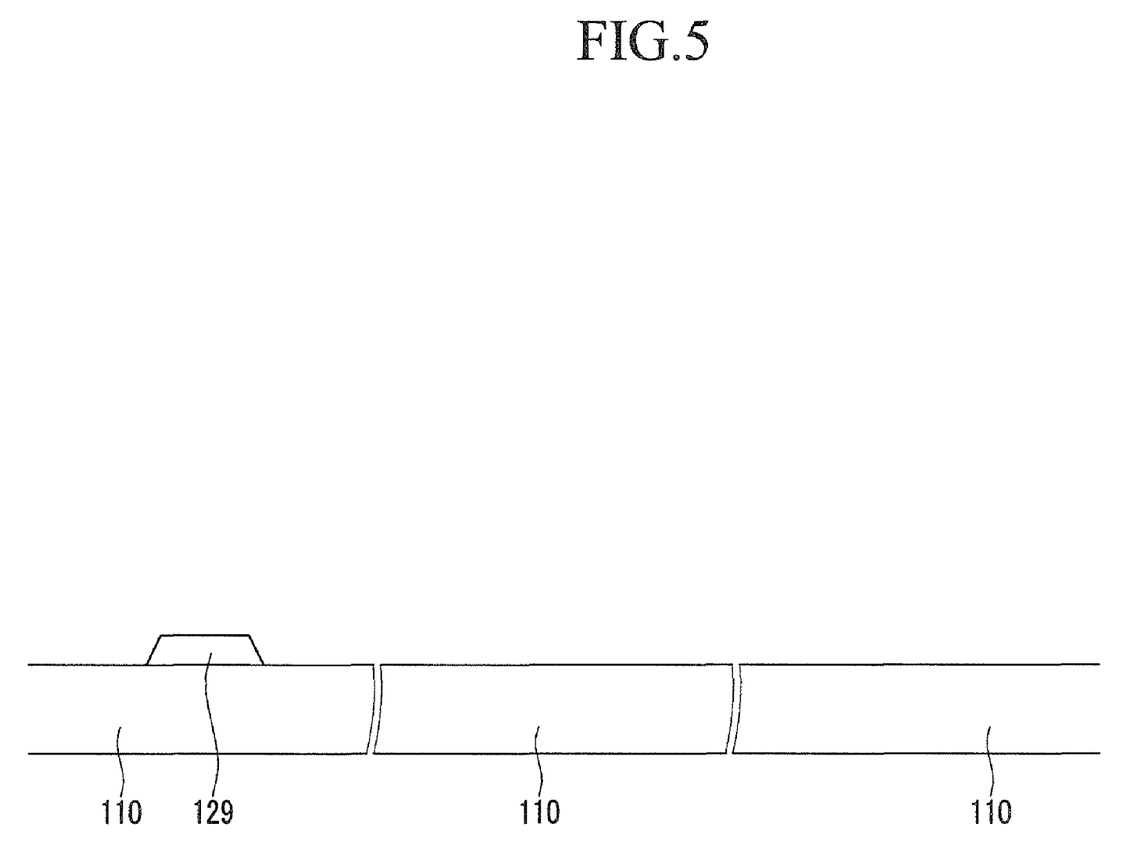

As shown in FIG. 4 and FIG. 5, a gate line 121 including an end portion 129 is formed on a substrate 110. A copper layer is deposited through a sputtering method and is patterned to form the gate line 121. The copper layer may be formed through an electroplating process or electroless plating (also known as chemical or auto-catalytic plating). In one embodiment, the copper is plated on a seed layer.

Figure 6:
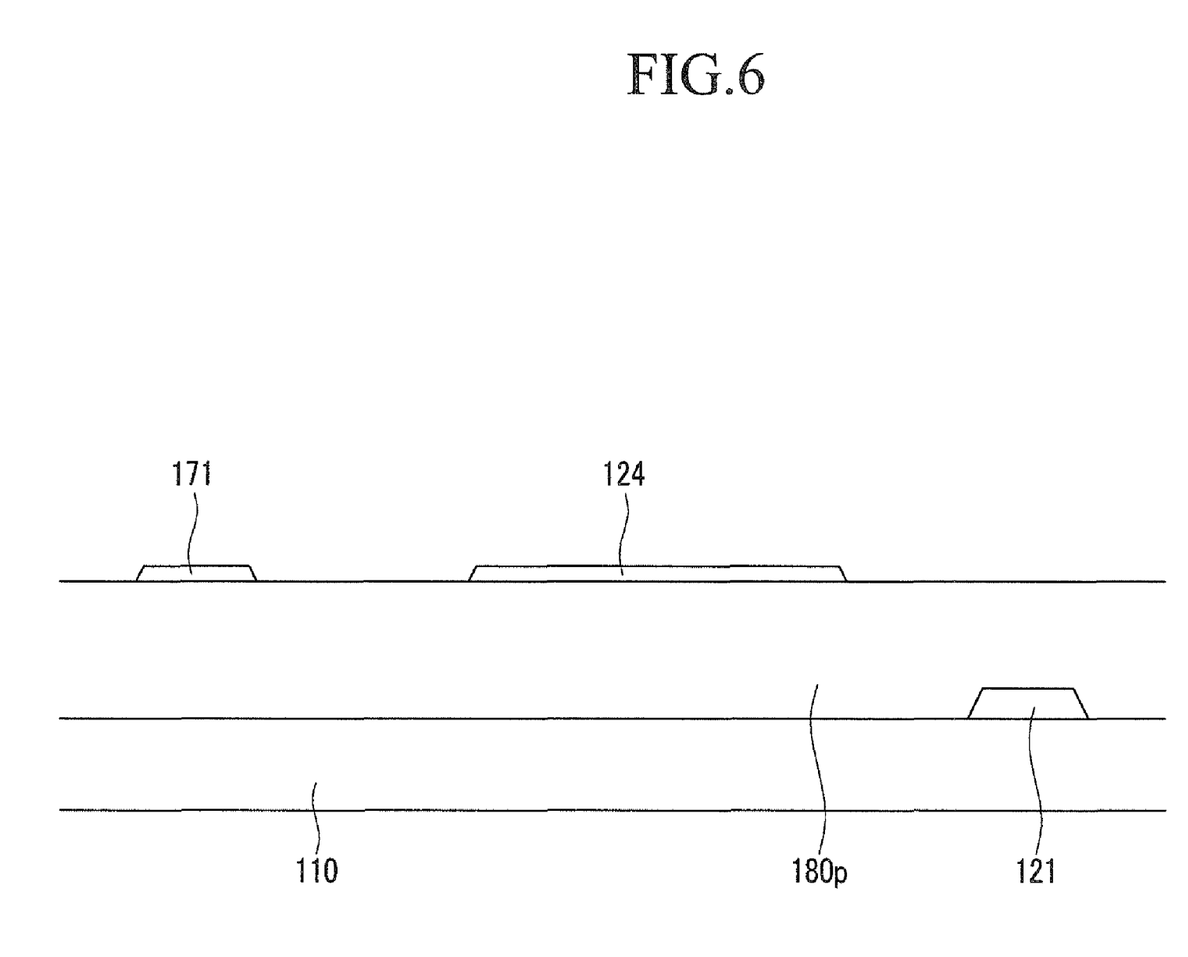
Figure 7:
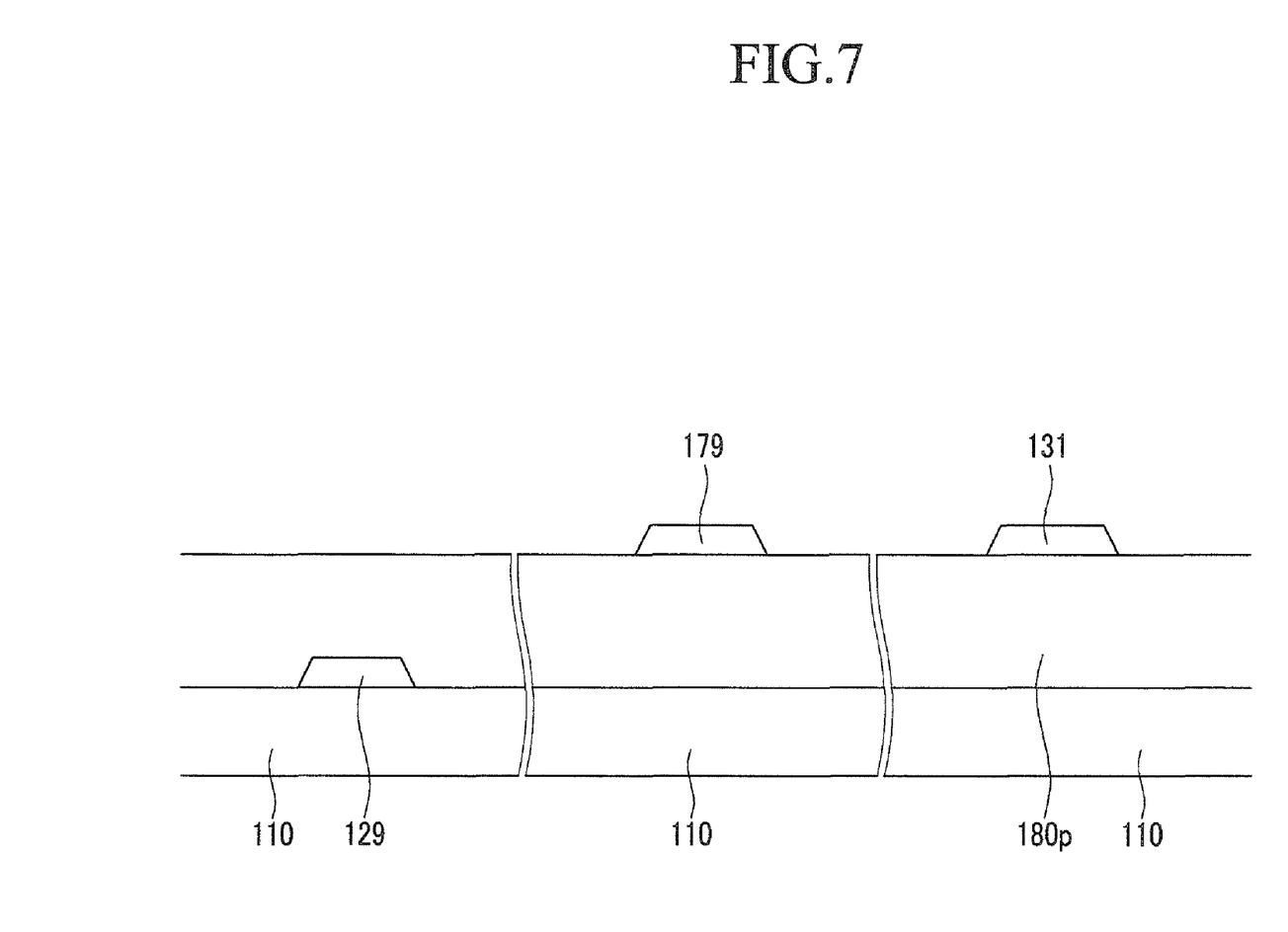

As shown in FIG. 6 and FIG. 7, an organic material is coated on the gate line 121 to form the first interlayer insulating layer 180p. The first interlayer insulating layer 180p planarizes the substrate. Next, a metal is deposited on the first interlayer insulating layer 180p and patterned to form a gate electrode 124, a storage electrode line 131, and a data line 171 including an end portion 179.

Figure 8:
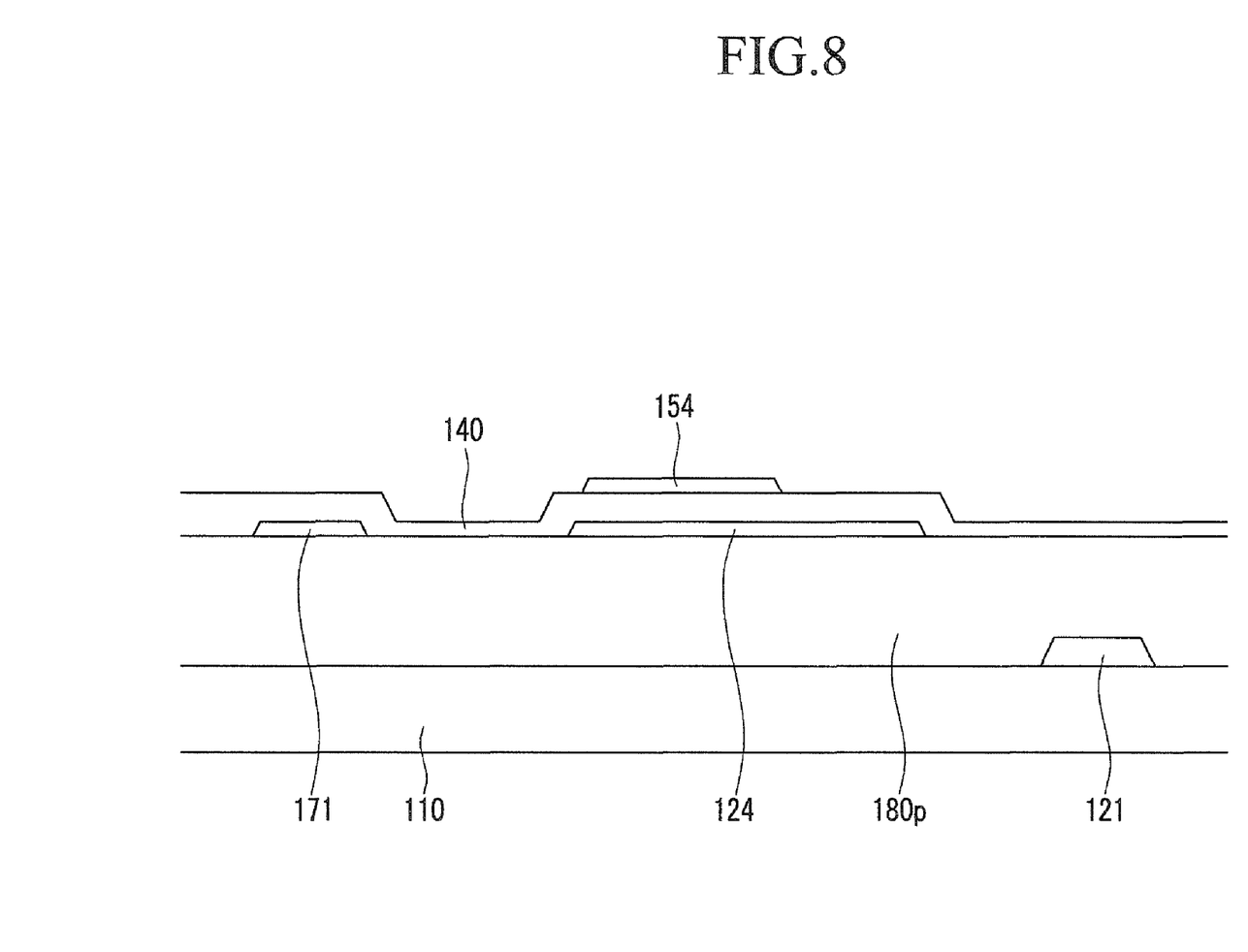
Figure 9:
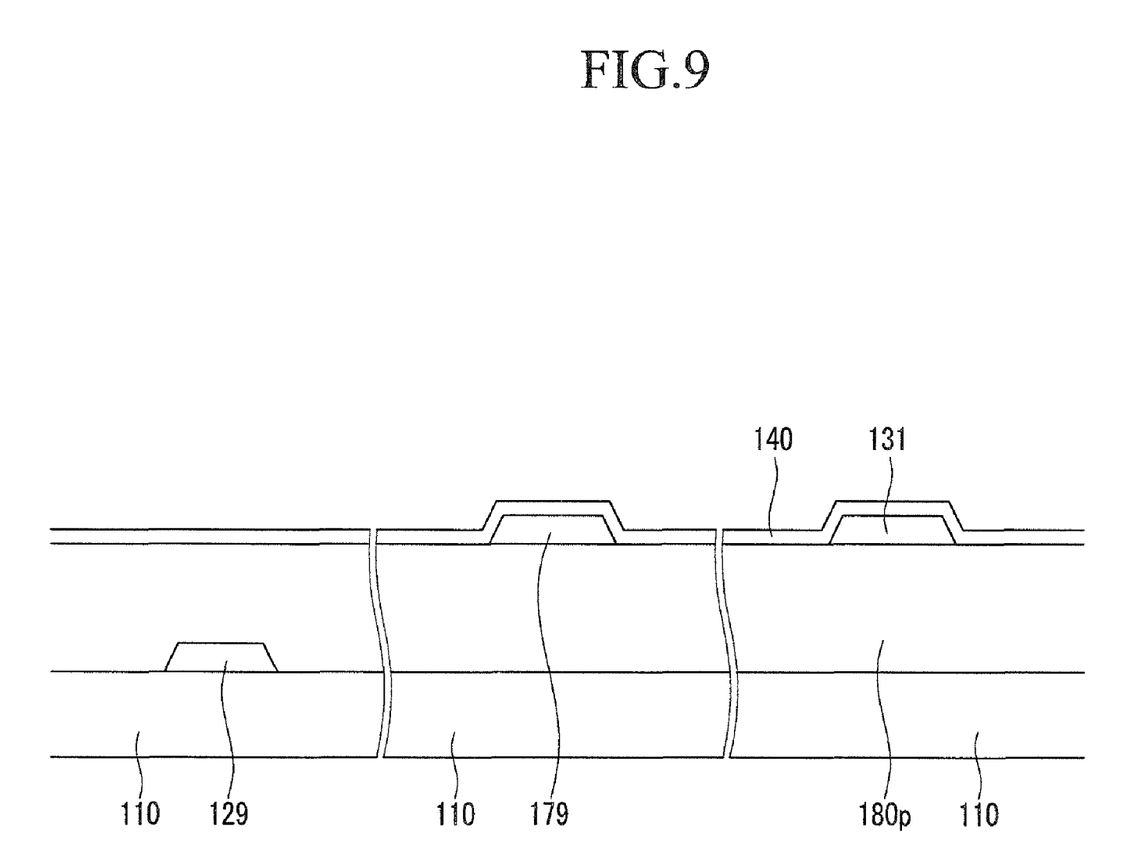

As shown in FIGS. 8 and 9, a gate insulating layer 140 is formed on the gate electrode 124, the storage electrode line 131, and the data line 171. The gate insulating layer 140 may be made of silicon oxide (SiO2) or silicon nitride (SiNx).

Next, a semiconductor 154 is formed on the gate insulating layer 140. An oxide including, for example, zinc (Zn), gallium (Ga), tin (Sn), or indium (In), or an oxide semiconductor of a composite oxide thereof—such as zinc oxide (ZnO), indium-gallium-zinc oxide (InGaZnO4), indium-zinc oxide (Zn—In—O), or zinc-tin oxide (Zn—Sn—O)—may be deposited and patterned to form the semiconductor 154.

Figure 10:
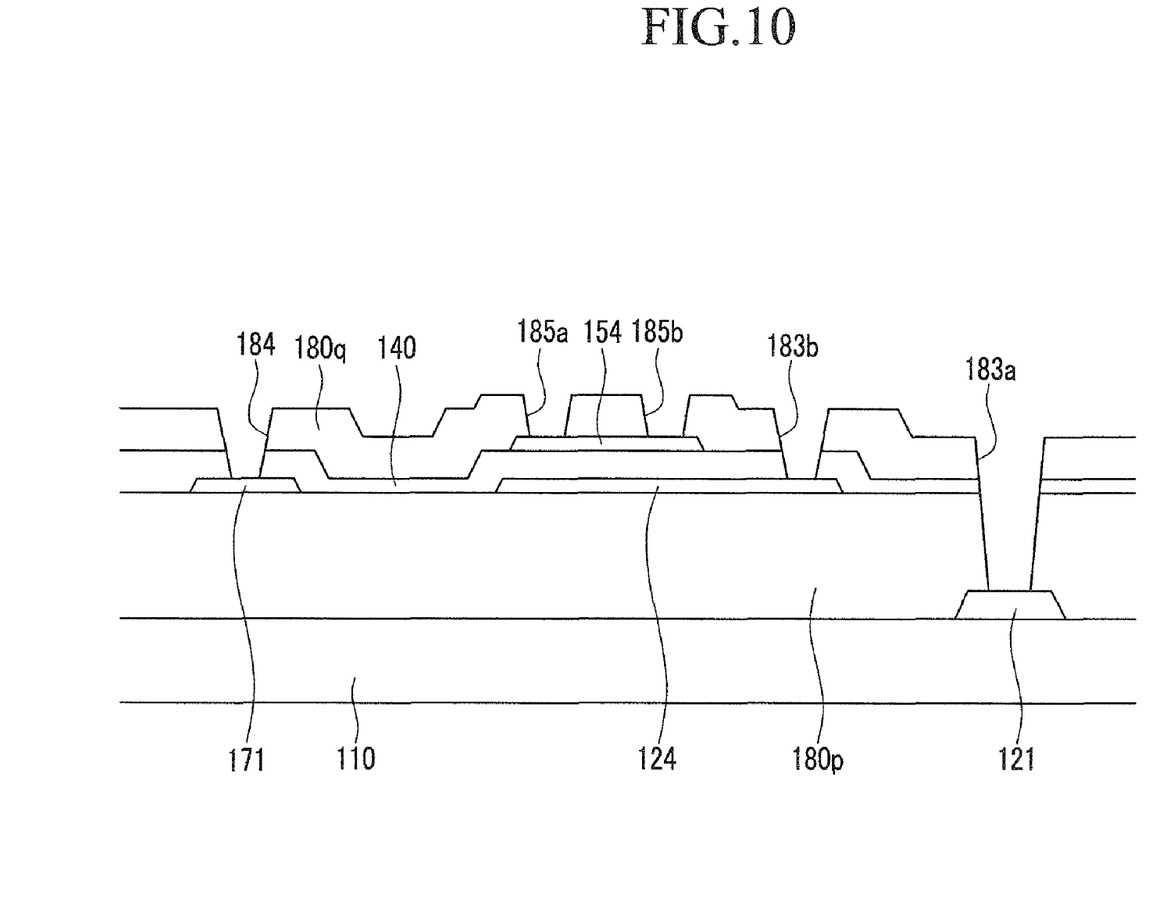
Figure 11:
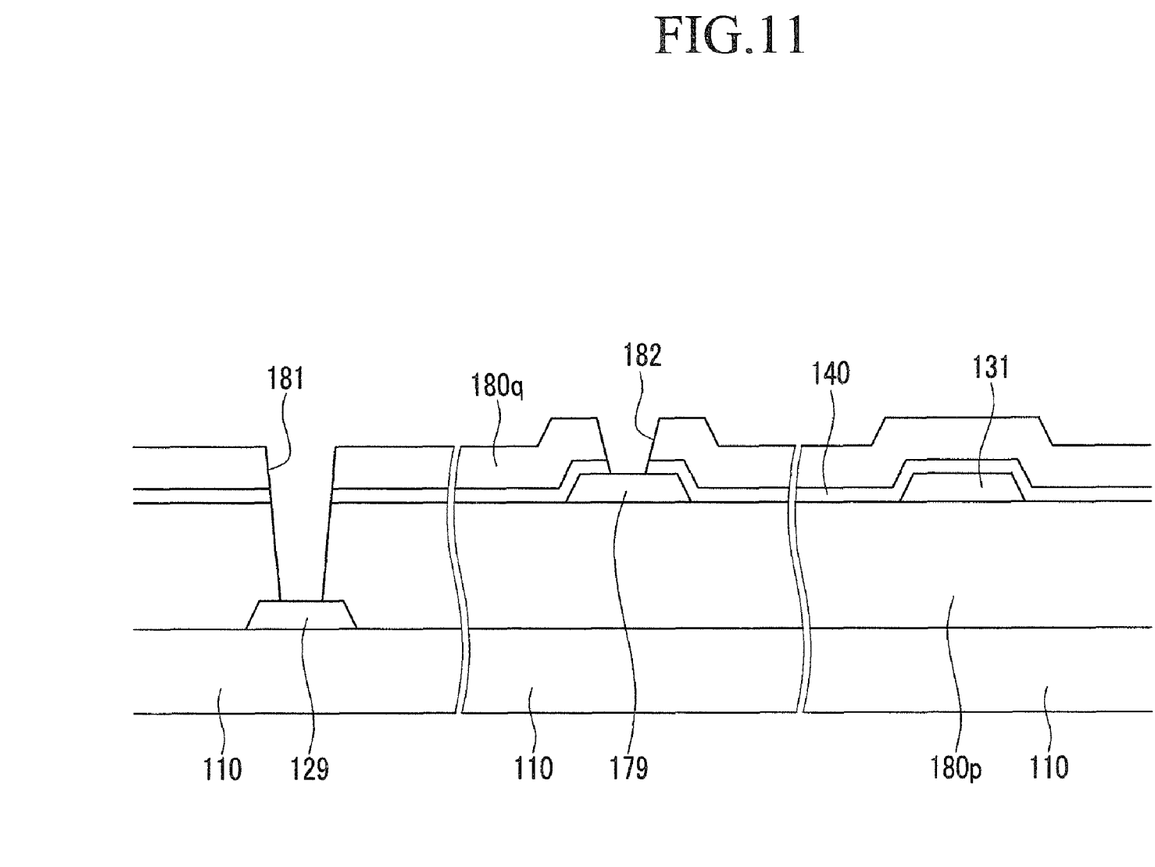

As shown in FIG. 10 and FIG. 11, the second interlayer insulating layer 180q is formed on the semiconductor 154. The second interlayer insulating layer 180q may be made of silicon oxide or silicon nitride. Next, the second interlayer insulating layer 180q, the gate insulating layer 140, and the first interlayer insulating layer 180p are etched to form the first and second contact holes 185a and 185b exposing the semiconductor 154, contact holes 184 and 183b exposing the data line 171 and the gate electrode 124, and a contact hole 183a exposing the gate line 121.

Next, as shown in FIG. 1, a transparent conductive layer is formed on the second interlayer insulating layer 180q, and is patterned to form a pixel electrode 191 connected to the semiconductor 154 through the contact hole 185b; as well as the first connection 83 connected to the gate electrode 124 and the gate line 121 through the contact holes 183a and 183b; the second connection 84 connected to the data line 171 and the semiconductor 154 through the contact holes 184 and 185a; and the contact assistants 81 and 82 connected to the end portions 129 and 179 of the gate line 121 and the data line 171 through contact holes 181 and 182.

Figure 12:
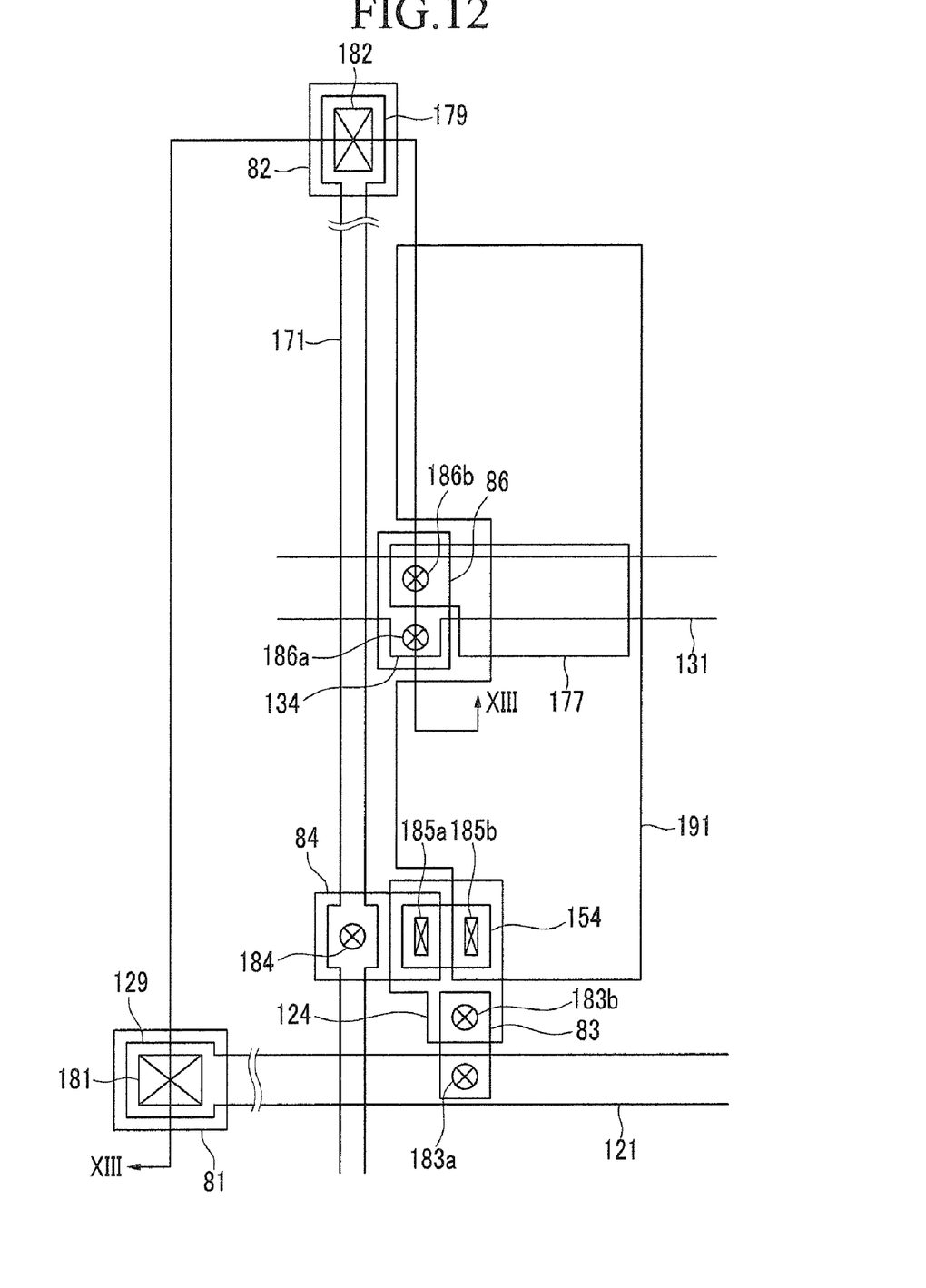
FIG. 12 is a layout view of a thin film transistor substrate according to another embodiment of the present invention.
Figure 13:
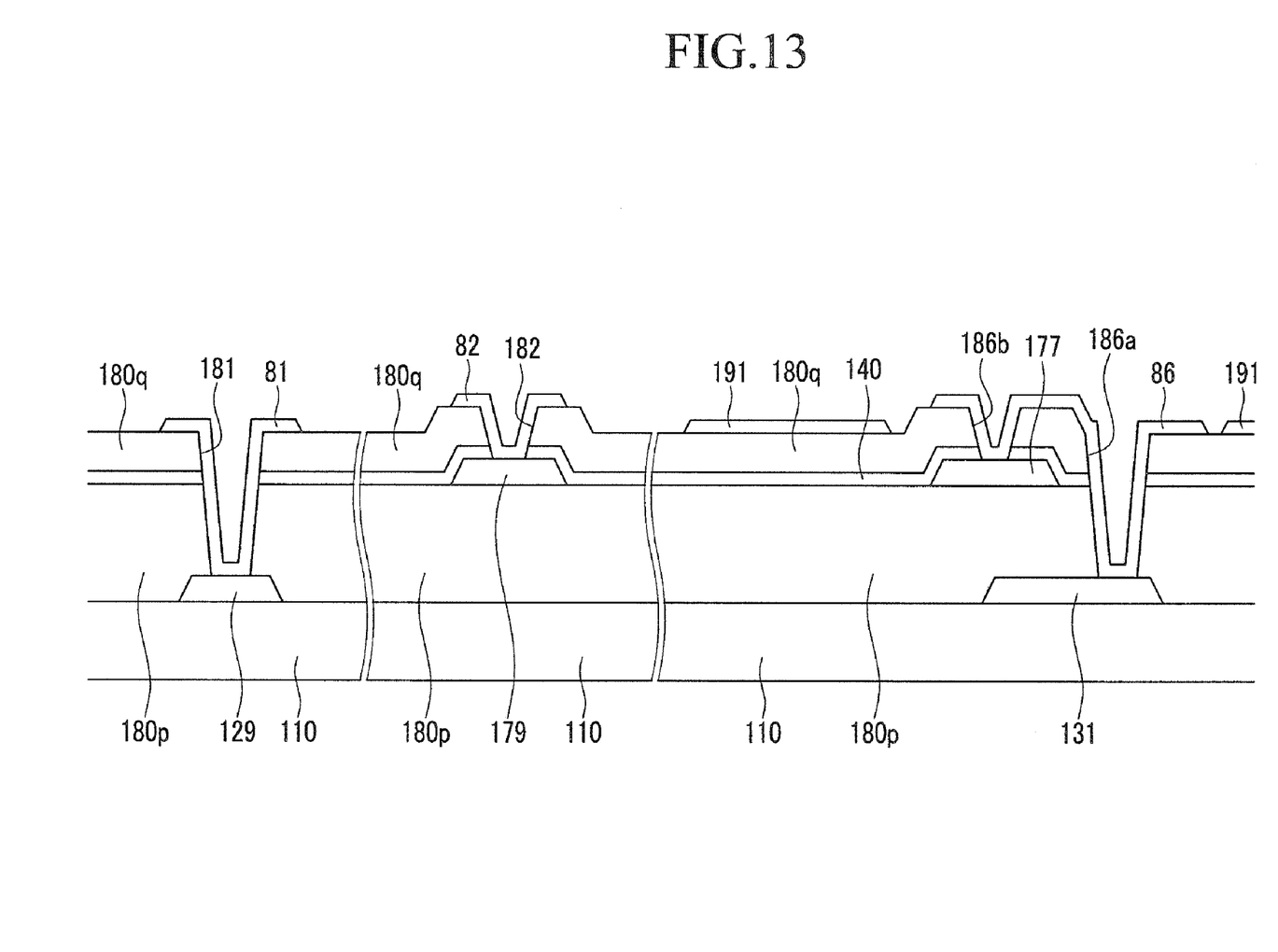
FIG. 13 is a cross-sectional view taken along the line XIII-XIII of FIG. 12 according to an embodiment of the present invention.

FIG. 12 is a layout view of a thin film transistor substrate according to another embodiment of the present invention, and FIG. 13 is a cross-sectional view taken along the line XIII-XIII of FIG. 12 in accordance with an embodiment.

The layered structure of the thin film transistor substrate of FIGS. 12 and 13 is almost the same as that of the first embodiment, shown in FIG. 1 through FIG. 3. In the second embodiment, shown in FIG. 12 and FIG. 13, the storage electrode line 131 is formed with the same layer as the gate line, differently from the first embodiment.

Referring to FIG. 12 and FIG. 13, a gate line 121, having an end portion 129, and a storage electrode line 131 are formed on a transparent insulation substrate 110. The storage electrode line 131 includes a protrusion 134 for connection with other layers.

The gate line 121 and the storage electrode line 131 are made of Cu, and may be formed through sputtering or plating. When forming through plating, a seed layer may be formed under the copper layer. The seed layer may be made of Ti or Ni.

The first interlayer insulating layer 180p is formed on the gate line 121. A gate electrode 124, a capacitive conductor 177, and a data line 171 are formed on the first interlayer insulating layer 180p. The data line 171 includes an end portion 179 having a wide area and extends in the longitudinal direction, thereby intersecting the gate line 121. The capacitive conductor 177 includes a protrusion overlapping the storage electrode line 131.

A gate insulating layer 140 is formed on the gate electrode 124, the capacitive conductor 177, and the data line 171. An oxide semiconductor 154 is formed on the gate insulating layer 140, and the second interlayer insulating layer 180q is formed on the semiconductor 154.

The second interlayer insulating layer 180q has first and second contact holes 185a and 185b exposing the semiconductor 154. The second interlayer insulating layer 180q and the gate insulating layer 140 have contact holes 184, 183b, and 186b exposing, respectively, the data line 171, the gate electrode 124, and the capacitive conductor 177. The second interlayer insulating layer 180q, the gate insulating layer 140, and the first interlayer insulating layer 180p have contact holes 183a and 186a exposing, respectively, the gate line 121 and the storage electrode line 131.

A pixel electrode 191, first to third connections 83, 84, and 86, and contact assistants 81 and 82 are formed on the second interlayer insulating layer 180q. The pixel electrode 191 is connected to the semiconductor 154 through the contact hole 185b, the first connection 83 is connected to the gate electrode 124 and the gate line 121 through the contact holes 183a and 183b; the second connection 84 is connected to the data line 171 and the semiconductor 154 through the contact holes 184 and 185a; and the third connection 86 is connected to the storage electrode line 131 and the capacitive conductor 177 through the contact holes 186a and 186b. The pixel electrode 191, the first and second connections 83 and 84, and the contact assistants 81 and 82 may be made of a transparent conductive oxide such as ITO or IZO.

Differently from the first embodiment, the storage electrode line 131 is formed with the same layer as the gate line 121, and the capacitive conductor 177 connected to the storage electrode line 131 is formed between the storage electrode line 131 and the pixel electrode 191. Accordingly, the voltage transmitted to the capacitive conductor 177 through the connection 86 from the storage electrode line 131 forms a capacitance along the pixel electrode 191 by using the gate insulating layer 140 and the second interlayer insulating layer 180q as a dielectric material.

The thin film transistor substrate for the liquid crystal display according to the second embodiment may be made through the same method as the first embodiment shown in FIG. 4 to FIG. 11.

For example, the gate line 121 is formed on the substrate 110, the first interlayer insulating layer 180p is formed on the gate line 121; the data line 171 and the gate electrode 124 are formed on the first interlayer insulating layer 180p; the gate insulating layer 140 is formed on the data line 171 and the gate electrode 124; the semiconductor 154 is formed on the gate insulating layer 140; the second interlayer insulating layer 180q is formed on the semiconductor 154; the contact holes 181, 182, 183a, 183b, 184, 185a, and 185b are formed in the gate insulating layer 140; and the first and second interlayer insulating layers 180p and 180q, the first and second connections 83 and 84, and the pixel electrode 191 are formed on the second interlayer insulating layer 180q.

However, differently from the first embodiment, in the second embodiment, the storage electrode line 131 is formed along with the gate line 121, and the capacitive conductor 177 is additionally formed along with the data line 171. Also, the contact holes 186a and 186b exposing the storage electrode line 131 and the capacitive conductor 177 are formed when forming the contact holes 181, 182, 183a, 183b, 184, 185a, and 185b. The third connection 86 connected to the storage electrode line 131 and the capacitive conductor 177 through the contact holes 186a and 186b is formed along with the first and second connections 83 and 84.

While embodiments of this invention have been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor substrate comprising:
   an insulation substrate;
   a gate line formed on the insulation substrate;
   a first interlayer insulating layer formed on the gate line;
   a data line and a gate electrode formed on the first interlayer insulating layer;
   a gate insulating layer formed on the data line and gate electrode;
   a semiconductor formed on the gate insulating layer and overlapping the gate electrode;
   a second interlayer insulating layer formed on the semiconductor;
   a first connection formed on the second interlayer insulating layer and electrically connecting the gate line and the gate electrode to each other;
   a drain electrode connected to the semiconductor;
   a pixel electrode connected to the drain electrode; and
   a second connection connecting the data line and the semiconductor to each other.

2. The thin film transistor substrate of claim 1, wherein the pixel electrode, the drain electrode, and the first and second connections are formed of a same material.

3. The thin film transistor substrate of claim 2, wherein the pixel electrode and the drain electrode are formed as one body.

4. The thin film transistor substrate of claim 1, wherein the first interlayer insulating layer is made of an organic insulating material.

5. The thin film transistor substrate of claim 1, wherein the gate line includes a copper layer.

6. The thin film transistor substrate of claim 5, wherein the gate line further includes a seed layer formed under the copper layer.

7. The thin film transistor substrate of claim 6, wherein the seed layer is made of Ti or Ni.

8. The thin film transistor substrate of claim 5, wherein the semiconductor is made of an oxide semiconductor.

9. The thin film transistor substrate of claim 8, wherein the semiconductor is made of an oxide semiconductor including at least one of Zn, Ga, Sn, Hf, and In.

10. The thin film transistor substrate of claim 8, further comprising a storage electrode line formed on the first interlayer insulating layer and parallel to the data line.

11. The thin film transistor substrate of claim 10, wherein the storage electrode line includes a plurality of storage electrodes extending from the storage electrode line.

12. The thin film transistor substrate of claim 8, further comprising a storage electrode line formed on the insulation substrate and parallel to the gate line.

13. The thin film transistor substrate of claim 12, wherein the storage electrode line includes a plurality of protrusions extending from the storage electrode line.

14. The thin film transistor substrate of claim 12, further comprising a capacitive conductor formed on the first interlayer insulating layer and connected to the storage electrode line.

15. The thin film transistor substrate of claim 14, further comprising a third connection formed on the second interlayer insulating layer and connecting the storage electrode line and the capacitive conductor to each other.

16. The thin film transistor substrate of claim 15, wherein the third connection is made of a same material as the pixel electrode.

17. The thin film transistor substrate of claim 1, wherein the semiconductor is made of an oxide semiconductor.

18. The thin film transistor substrate of claim 1, further comprising a storage electrode line formed on the first interlayer insulating layer and parallel to the data line.

19. The thin film transistor substrate of claim 1, further comprising:
   a storage electrode line formed on the insulation substrate and parallel to the gate line;
   a capacitive conductor formed on the first interlayer insulating layer and overlapping the pixel electrode; and
   a third connection formed on the second interlayer insulating layer and connecting the storage electrode line and the capacitive conductor to each other.

20. The thin film transistor substrate of claim 1, wherein the second interlayer insulating layer is made of silicon oxide or silicon nitride.

* * * * *